United States Patent
Hafuka

(10) Patent No.: US 9,356,771 B2
(45) Date of Patent: May 31, 2016

(54) METHOD OF GENERATING CLOCK AND SEMICONDUCTOR DEVICE

(71) Applicant: LAPIS SEMICONDUCTOR CO., LTD., Kanagawa (JP)

(72) Inventor: Takamitsu Hafuka, Kanagawa (JP)

(73) Assignee: LAPIS SEMICONDUCTOR CO., LTD., Kanagawa (JP)

( * ) Notice: Subject to any disclaimer, the term of this patent is extended or adjusted under 35 U.S.C. 154(b) by 0 days.

(21) Appl. No.: 14/662,308

(22) Filed: Mar. 19, 2015

(65) Prior Publication Data

US 2015/0280901 A1    Oct. 1, 2015

(30) Foreign Application Priority Data

Mar. 26, 2014    (JP) ................................ 2014-064338

(51) Int. Cl.
H04L 7/027    (2006.01)
H04L 7/033    (2006.01)

(52) U.S. Cl.
CPC .............. *H04L 7/027* (2013.01); *H04L 7/0334* (2013.01); *Y02B 60/31* (2013.01)

(58) Field of Classification Search
CPC ..... H03L 7/183; H03L 7/1976; H03L 7/0814; H03L 7/0995; H03L 7/18; H03L 7/197; H03L 7/23; H04L 7/0008; H04L 7/0037; H04L 7/027; H04L 7/10; H04L 27/1566
USPC .......................... 375/355, 359, 371–373, 377
See application file for complete search history.

(56) References Cited

U.S. PATENT DOCUMENTS

| | | | | |
|---|---|---|---|---|
| 6,275,952 B1 * | 8/2001 | Kachi | ....................... | G06F 1/08 713/500 |
| 6,323,713 B1 * | 11/2001 | Yuzue | ....................... | G06F 1/08 327/116 |
| 6,956,395 B2 * | 10/2005 | Oshima | ............ | G01R 31/31928 324/73.1 |
| 7,439,936 B2 * | 10/2008 | Kinugasa | .............. | G06F 3/1423 345/1.1 |
| 7,808,306 B2 * | 10/2010 | Ito | ......................... | H02M 3/157 327/158 |
| 7,920,835 B2 * | 4/2011 | Miyagi | .................... | H03C 3/40 455/112 |
| 8,401,136 B2 * | 3/2013 | Fujiwara | ................... | G06F 1/04 360/70 |
| 8,937,843 B2 * | 1/2015 | Kinoshita | .......... | G11C 11/4076 365/194 |
| 9,203,344 B2 * | 12/2015 | Kim | ..................... | H03B 21/025 |
| 2013/0003508 A1 * | 1/2013 | Kato | ..................... | G04G 3/027 368/201 |

FOREIGN PATENT DOCUMENTS

JP    2010-087820 A    4/2010

* cited by examiner

*Primary Examiner* — Emmanuel Bayard
(74) *Attorney, Agent, or Firm* — Kubotera & Associates, LLC

(57) ABSTRACT

A method of generating a clock includes the steps of calculating a first frequency division number through dividing a frequency of an input clock by a target frequency and a specific integer k ($k \geq 2$); calculating a second frequency division number according to the first frequency division number; dividing a period of time of one cycle of the target frequency by the specific integer k to obtain sections in a number of the specific integer k; dividing the frequency of the input clock with the second frequency division number within one of the sections; dividing the frequency of the input clock with the second frequency division number within each remaining one of the sections in a number of (k−1); and generating the clock having a frequency with one cycle equal to a period of time corresponding to each of the sections.

13 Claims, 6 Drawing Sheets

METHOD OF GENERATING CLOCK AND SEMICONDUCTOR DEVICE

BACKGROUND OF THE INVENTION AND RELATED ART STATEMENT

The present invention relates to a method of generating a clock and a semiconductor device.

In a communication system such as a wireless communication system, when a whole communication system is operated, a clock signal (a data rate clock) having a frequency is supplied to each component of the communication system according to a processing speed (a data rate) of a data signal of each component. Accordingly, in the communication system, it is necessary to generate the data rate clocks having various frequencies. To this end, the clock source is configured to generate a master clock having an accurately stabilized oscillation frequency, and the frequency of the master clock is divided to generate the data rate clocks having various frequencies, in consideration of simplification of a clock source of the data rate clock, synchronization of the whole communication system, and the like.

As an example of a conventional technique for dividing the frequency of the clock, there has been a method of dividing a frequency (an integer number frequency division method) with a frequency division ratio of an integer number (a frequency division integer number).

FIG. 4 is a block diagram showing a configuration of a conventional clock generating circuit 200 using the integer number frequency division method. FIG. 5 is a block diagram showing a clock frequency dividing circuit 50 of the conventional clock generating circuit 200. FIG. 6 is a time chart showing signals of the conventional clock generating circuit 200. It should be noted that, as an example of the conventional technique, the conventional clock generating circuit 200 performs an oversampling operation on the data rate with an oversampling rate k.

As shown in FIG. 4, the conventional clock generating circuit 200 (a frequency dividing circuit using the integer number frequency division method) includes the clock frequency dividing circuit 50; a data rate clock generating circuit 51; and a frequency division integer number (N) storage register 52. It should be noted that the frequency division integer number (N) storage register 52 stores a frequency division integer number (N).

In the conventional clock generating circuit 200, the clock frequency dividing circuit 50 is configured to receive a master clock S50, and to divide a frequency of the master clock S50 to generate a frequency divided clock S51. The data rate clock generating circuit 51 is configured to receive the frequency divided clock S51, and to further divide a frequency of the frequency divided clock S51 with the oversampling rate k to generate and output a data rate clock S53.

As shown in FIG. 5, the clock frequency dividing circuit 50 of the conventional clock generating circuit 200 includes a clock frequency dividing counter 53; a comparing unit 54; and a gate circuit 55.

In the clock frequency dividing circuit 50 of the conventional clock generating circuit 200, the clock frequency dividing counter 53 is configured to perform count up on the master clock S50 as an operation clock to output a counted-up value. The comparing unit 54 is configured to compare the counted-up value with a signal S52 indicating the frequency division integer number (N) retrieved from the frequency division integer number (N) storage register 52. When the counted-up value reaches the frequency division integer number (N), the comparing unit 54 is reset.

As shown in FIG. 6, a wave chart (a) represents an operation wave form of a clock frequency division counter value S54 as an output signal of the clock frequency dividing counter 53.

In the clock frequency dividing circuit 50, the gate circuit 55 is configured to calculate a logic product of an output S55 of the comparing unit 54 and the master clock S50, so that the gate circuit 55 generates the frequency divided clock S51. As shown in FIG. 6, a wave chart (b) represents the frequency divided clock S51.

In the conventional clock generating circuit 200, the data rate clock generating circuit 51 is configured to count the frequency divided clock S51 according to the oversampling rate k. As shown in FIG. 6, a wave chart (c) represents an oversampling counter value.

In the conventional clock generating circuit 200, the oversampling rate k is set to 10 (k=10). Accordingly, the oversampling counter value is in a range between 0 and 9. As shown in FIG. 6, a wave chart (d) represents the data rate clock S53 output as the frequency divided clock of the conventional clock generating circuit 200 and obtained through dividing the frequency of the frequency divided clock S51 according to the oversampling counter value.

Further, Patent Reference has disclosed a conventional clock frequency division method. In the conventional clock frequency division method disclosed in Patent Reference, an input clock pulse is masked at a specific timing, so that the input clock pulse thus masked is substantially delayed. Accordingly, a number of the clock pulse to be divided is adjusted, so that an average frequency of a divided clock becomes closer to an ideal clock frequency.

Patent Reference: Japanese Patent Publication No. 2010-087820

In the conventional clock generating circuit 200 described above, when the data rate is not divisible with the frequency division integer number (N), the frequency of the divided clock is shifted from the data rate. An example of the case will be explained below.

First, the frequency division integer number (N) is given by the following equation (1).

$$N = \text{round}\{f0/(D*k)\} \quad (1)$$

where f0 represents the frequency of the master clock (that is, the clock before the frequency division as the base for generating the data rate clock); D represents the data clock; and k represents the oversampling rate. In the equation (1), "round" is a function of obtaining a quotient of division and rounding a result of the division.

Further, the frequency of the data clock rate fD after the frequency division is given by the following equation (2) using the frequency division integer number (N) calculated with the equation (1).

$$fD = f0/(N*k) \quad (2)$$

It is assumed that the frequency of the master clock f0 is 26 MHz (f0=26); the data clock D is 2.4 kbps (D=2.4); and the oversampling rate k is 10 (k=10). According to the equation (1), the frequency division integer number (N) is calculated to be 1083 (N=1083). Accordingly, using the equation (2), the frequency of the data clock rate fD is obtained as 2.4007386 kHz (fD=2.4007386). As a result, the frequency of the data clock rate fD is shifted from the data rate (2.4 kbps) by 308 ppm.

There may be a case that the shift of the data rate clock (a data rate deviation) from the data rate with the frequency fD is regulated according to standard specification and the like (for example, 100 ppm). If it's the case, when the data rate deviation is large, it may not be able to meet the standard specification.

In order to reduce the data rate deviation, it may be configured such that the frequency of the master clock is adjusted. However, when the frequency of the master clock is adjusted, the master clock no longer has a common frequency. Accordingly, it is difficult to reduce a cost of the master clock source (for example, a cost of an oscillation element), thereby increasing a cost of the communication system.

As another approach for reducing the data rate deviation, it may be configured such that a PLL (Phase Locked Loop) is adopted. When the PLL is used, it is possible to generate the master clock with the frequency integer number times of the data rate. With the approach, even when the integer number frequency division method is used, it is possible to generate the data rate clock with a minimum data rate deviation. However, when the PLL is used, it is difficult to reduce power consumption of the communication system.

In the clock frequency division method described in Patent Reference, an average frequency obtained through observing the output clock with the divided frequency over a specific period of time may be close to the data rate. However, individual clock wave forms still include pluses with a long time span and pluses with a short time span. Accordingly, in principle, the wave form of the output clock has a temporal fluctuation (so-called jitter).

In view of the problems of the conventional semiconductor device described above, an object of the present invention is to provide a method of generating a clock and a semiconductor device capable of generating a clock with a lower cost configuration and lower power consumption. Further, it is possible to minimize a data rate deviation from a target frequency and a temporal fluctuation.

Further objects and advantages of the invention will be apparent from the following description of the invention.

SUMMARY OF THE INVENTION

In order to attain the objects described above, according to a first aspect of the present invention, a method of generating a clock includes the steps of calculating a first frequency division number through dividing a frequency of an input clock by a target frequency and a specific integer k (k≥2); calculating a second frequency division number according to the first frequency division number; dividing a period of time of one cycle of the target frequency by the specific integer k to obtain sections in a number of the specific integer k; dividing the frequency of the input clock with the second frequency division number within one of the sections; dividing the frequency of the input clock with the second frequency division number within each remaining one of the sections in a number of (k−1); and generating the clock having a frequency with one cycle equal to a period of time corresponding to each of the sections in the number of the specific integer k obtained through dividing the frequency of the input clock.

According to a second aspect of the present invention, a semiconductor device includes a calculation unit configured to calculate a first frequency division number through dividing a frequency of an input clock by a target frequency and a specific integer k (k≥2), and to calculate a second frequency division number according to the first frequency division number. The semiconductor device further includes a frequency dividing unit configured to divide a period of time of one cycle of the target frequency by the specific integer k to obtain sections in a number of the specific integer k, and to divide the frequency of the input clock with the second frequency division number within one of the sections. The frequency dividing unit is also configured to divide the frequency of the input clock with the second frequency division number within each remaining one of the sections in a number of (k−1). The semiconductor device further includes an outputting unit configured to output the clock having a frequency with one cycle equal to a period of time corresponding to each of the sections in the number of the specific integer k obtained through dividing the frequency of the input clock.

According to the present invention, it is possible to provide the method of generating the clock and the semiconductor device capable of generating the clock with a lower cost configuration and lower power consumption. Further, it is possible to minimize a data rate deviation from a target frequency and a temporal fluctuation.

DETAILED DESCRIPTION OF PREFERRED EMBODIMENTS

Hereunder, preferred embodiments of the present invention will be explained with reference to the accompanying drawings. First, a basic concept of the present invention will be explained.

In the embodiment, a method of generating a clock and a semiconductor device according to the present invention are applied to a transmission circuit using an FSK (Frequency Shift Keying) in a wireless communication system. Further, in the embodiment, a data rate is being oversampled.

In the embodiment, the method of generating the clock and the semiconductor device according to the present invention are capable of generating a data rate clock obtained through dividing a frequency of a master clock using two frequency division integer numbers, i.e., a frequency division integer number $N1$ and a frequency division integer number $N2$. It should be noted that the frequency division integer number $N1$ is a frequency division integer number calculated with a conventional method, and the frequency division integer number $N2$ is a frequency division integer number calculated according to the frequency division integer number $N1$.

In the embodiment, the frequency division integer number $N1$ and the frequency division integer number $N2$ are calculated with the following equations (3) and (4), respectively.

$$N1 = \text{round}\{f0/(D*k)\} \quad (3)$$

$$N2 = \text{round}\{(1/D - (k-1)/(f0/N1))/(1/f0)\} \quad (4)$$

where $f0$ represents the frequency of the master clock; $D$ represents the data clock; and $k$ represents an oversampling rate. Further, "round" is a function of obtaining a quotient through division, and rounding a result of the division.

In the embodiment, the frequency division integer number N2 is applied to a section specified with an oversampling counter value (between 0 and k−1) as a count value of the oversampling rate. It should be noted that the oversampling counter value is not limited to a specific number. In the embodiment, as described later, the oversampling counter value is set to zero (0). In the following description, the oversampling counter value thus set (zero in the embodiment) is also referred to as an N2 counter value. Further, in the embodiment, the N2 counter value corresponds to a section having a first derivation value at a smallest level in a wave form of a PLL frequency setting value after passing through a transmission filter constituting the transmission circuit (described later).

Next, the method of generating the clock and the semiconductor device according to the embodiment of the present invention will be explained in more detail with reference to FIGS. 1 to 3.

Figure 1:
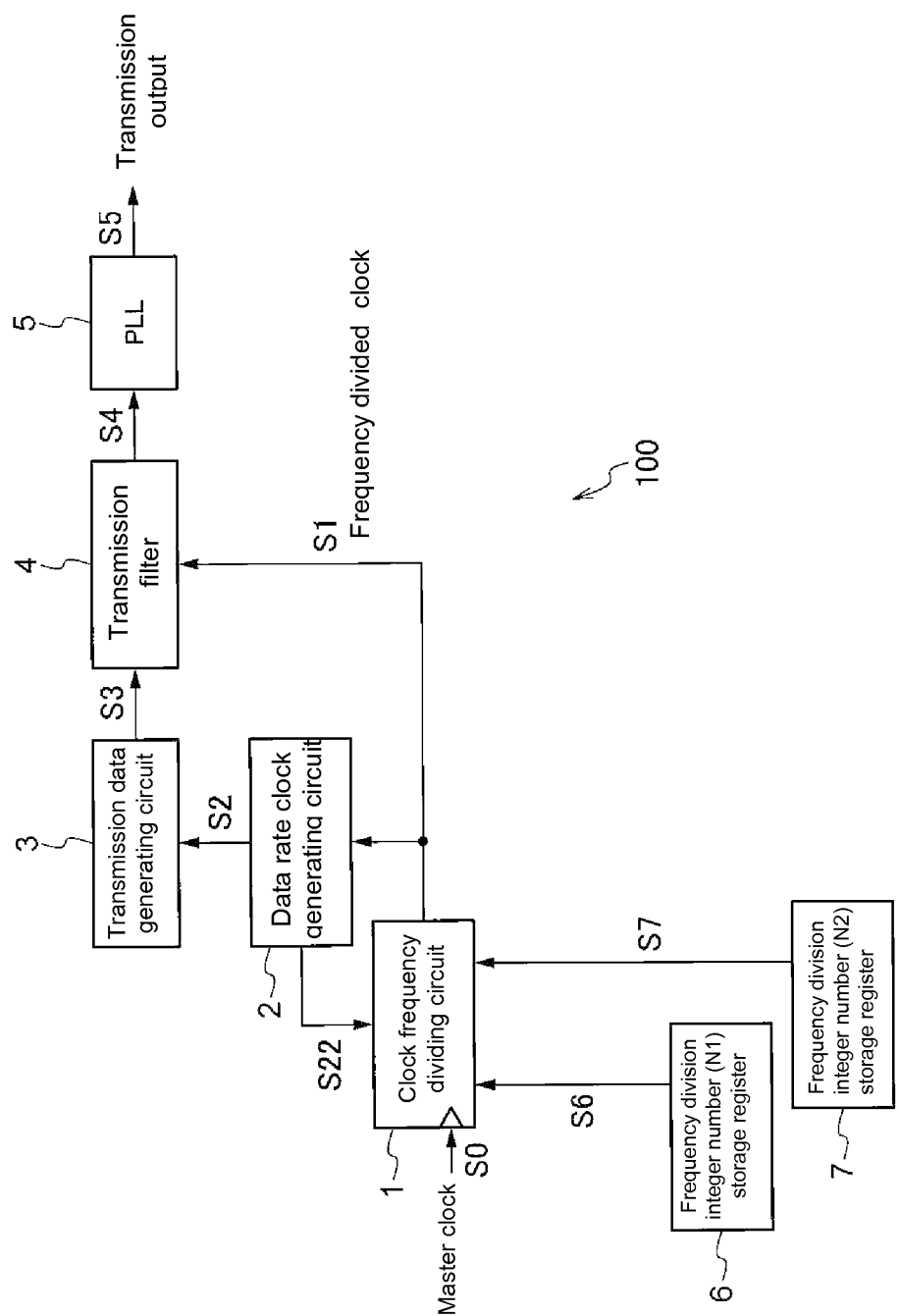
FIG. 1 is a block diagram showing a configuration of a semiconductor device according to an embodiment of the present invention.

FIG. 1 is a block diagram showing a configuration of a semiconductor device 100 according to the embodiment of the present invention. FIG. 2 is a block diagram showing a configuration of a clock frequency dividing circuit 1 of the semiconductor device 100 according to the embodiment of the present invention. FIG. 3 is a time chart showing signals of the semiconductor device 100 according to the embodiment of the present invention.

As shown in FIG. 1, the semiconductor device 100 includes the clock frequency dividing circuit 1; a data rate clock generating circuit 2; a transmission data generating circuit 3; a transmission filter 4; a PLL (Pulse Logic Loop) 5 as a phase synchronization type oscillator; a frequency division integer number (N1) storage register 6; and a frequency division integer number (N2) storage register 7.

In the embodiment, the clock frequency dividing circuit 1 shown in FIG. 1 is configured to receive a master clock S0. Further, the clock frequency dividing circuit 1 is configured to generate a frequency divided clock S1 having a frequency k times greater than that of the data rate according to the frequency division integer number N1, the frequency division integer number N2, and an oversampling counter value S22.

In the embodiment, the data rate clock generating circuit 2 is configured to receive the frequency divided clock S1, and to generate a data rate clock S2. Further, the data rate clock generating circuit 2 is configured to count the oversampling rate k, and to output a count result to the clock frequency dividing circuit 1 as an oversample counter value S22.

In the embodiment, the transmission data generating circuit 3 is configured to generate a transmission data S3 according to the data rate clock S2. More specifically, the transmission data generating circuit 3 is configured to retrieve a digital data signal to be transmitted at a timing of the data rate clock S2 (for example, a rising point of the data rate clock S2), and to output the digital data signal as the transmission data S3 at a specific timing.

In the embodiment, the transmission filter 4 is configured to receive the transmission data S3 and the frequency divided clock S1. Further, the transmission filter 4 is configured to perform a filtering process on the transmission data S3 with the frequency divided clock S1 as an operation clock, and to output a PLL frequency setting value S4 for setting a frequency of the PLL (Pulse Logic Loop) 5 at a later stage thereof.

In the embodiment, the PLL (Pulse Logic Loop) 5 is configured to switch a frequency of an RF (Radio Frequency) signal to be used in the FSK (Frequency Shift Keying), and to generate a transmission output signal S5.

A configuration of the clock frequency dividing circuit 1 will be explained in more detail next with reference to FIG. 2.

Figure 2:
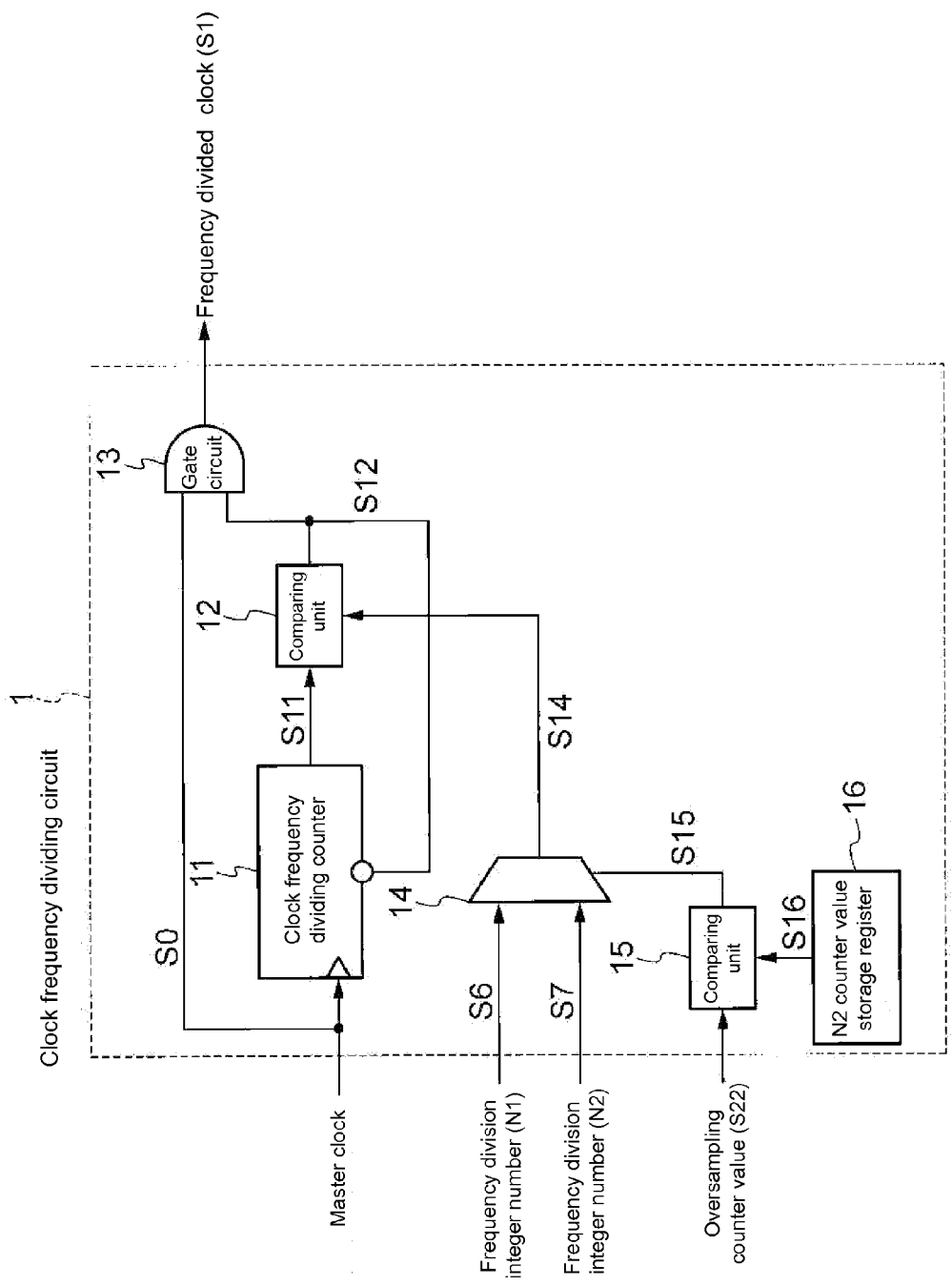
FIG. 2 is a block diagram showing a configuration of a clock frequency dividing circuit of the semiconductor device according to the embodiment of the present invention.

As shown in FIG. 2, the clock frequency dividing circuit 1 includes a clock frequency dividing counter 11; a comparing unit 12; a gate circuit 13; a selector 14; a comparing unit 15; and an N2 counter value storage register 16.

In the embodiment, the clock frequency dividing counter 11 is configured to perform a counter up with a master clock S0 as an operation clock, and to reset the count up according to a signal S12 transmitted from the comparing unit 12. Further, the clock frequency dividing counter 11 is configured to output a result of the count up as a clock frequency dividing counter value S11.

In the embodiment, the selector 14 is configured to switch and select between the frequency division integer number N1 (S6) and the frequency division integer number N2 (S7) according to a signal transmitted from the comparing unit 15, and to output a selection result, that is, the frequency division integer number N1 (S6) or the frequency division integer number N2 (S7), to the comparing unit 12 as an frequency division integer number signal S14. More specifically, for example, when the comparing unit 15 transmits the signal S15 with a low (L) level to the selector 14, the selector 14 is configured to select the frequency division integer number N1 (S6). When the comparing unit 15 transmits the signal S15 with a high (H) level to the selector 14, the selector 14 is configured to select the frequency division integer number N2 (S7).

In the embodiment, the N2 counter value storage register 16 is configured to store the N2 counter value as the counter value of the oversampling rate k to which the frequency division integer number N2 is applied.

In the embodiment, the comparing unit 15 is configured to compare the oversampling counter value S22 input thereto with the N2 counter value (S16) transmitted from the N2 counter value storage register 16. Further, the comparing unit 15 is configured to output a comparison result to the selector 14 as the signal S15. More specifically, when the comparing unit 15 determines that the oversampling counter value S22 matches to the N2 counter value (S16), the comparing unit 15 is configured to output the signal S15 with the high (H) level. When the comparing unit 15 determines that the oversampling counter value S22 does not match to the N2 counter value (S16), the comparing unit 15 is configured to output the signal S15 with the low (L) level.

In the embodiment, the comparing unit 12 is configured to compare the clock frequency dividing counter value S11 transmitted from the clock frequency dividing counter 11 with the frequency division integer number signal S14 transmitted from the selector 14. When the comparing unit 12 determines that the clock frequency dividing counter value S11 matches to the frequency division integer number signal S14, the comparing unit 12 is configured to output a signal with the high (H) level. When the comparing unit 12 determines that the clock frequency dividing counter value S11 does not match to the frequency division integer number signal S14, the comparing unit 12 is configured to output a signal with the low (L) level. In other words, every time when the count value of the master clock S0 reaches the frequency division integer number N1 or the frequency division integer number N2, the comparing unit 12 is configured to output the signal with the high (H) level as a signal S12. It should be noted that when the comparing unit 12 outputs the signal S12, the signal S12 functions as a reset signal so that the clock frequency dividing counter 11 resets the count up according to the frequency division integer number N1 or the frequency division integer number N2.

In the embodiment, the gate circuit 13 is configured to perform a gating of the master clock S0 to be a gated clock according to the signal S12, so that the gate circuit 13 generates the frequency divided clock S1. More specifically, the gate circuit 13 is configured to perform an operation such that the master clock S0 passes through the gate circuit 13 every time when the count value of the master clock S0 at the clock frequency dividing counter 11 reaches the frequency division integer number N1 or the frequency division integer number N2.

Next, various signals of the semiconductor device 100 that change with time will be explained with reference to FIG. 3.

Figure 3:
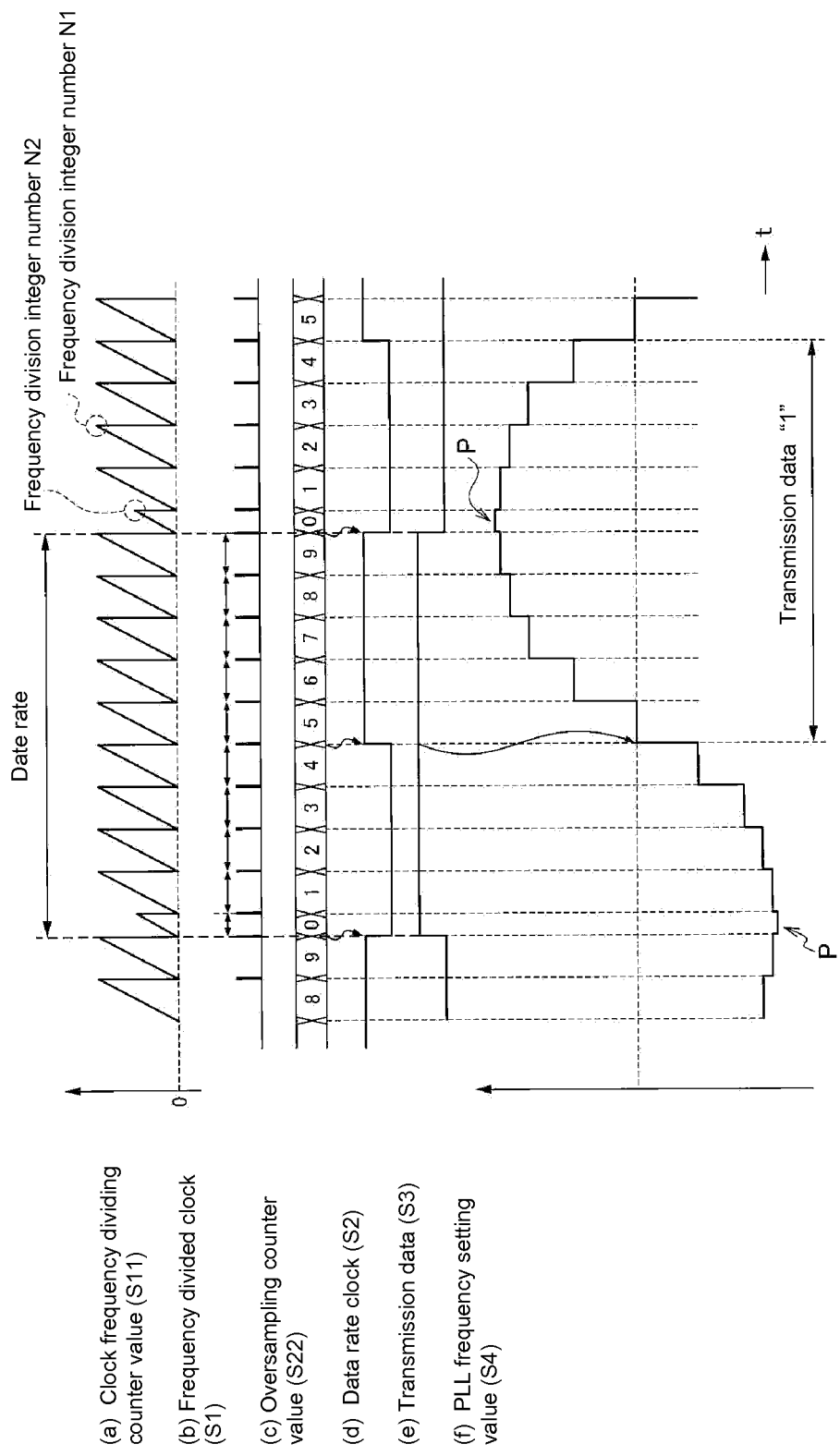
FIG. 3 is a time chart showing signals of the semiconductor device according to the embodiment of the present invention.
Figure 4:
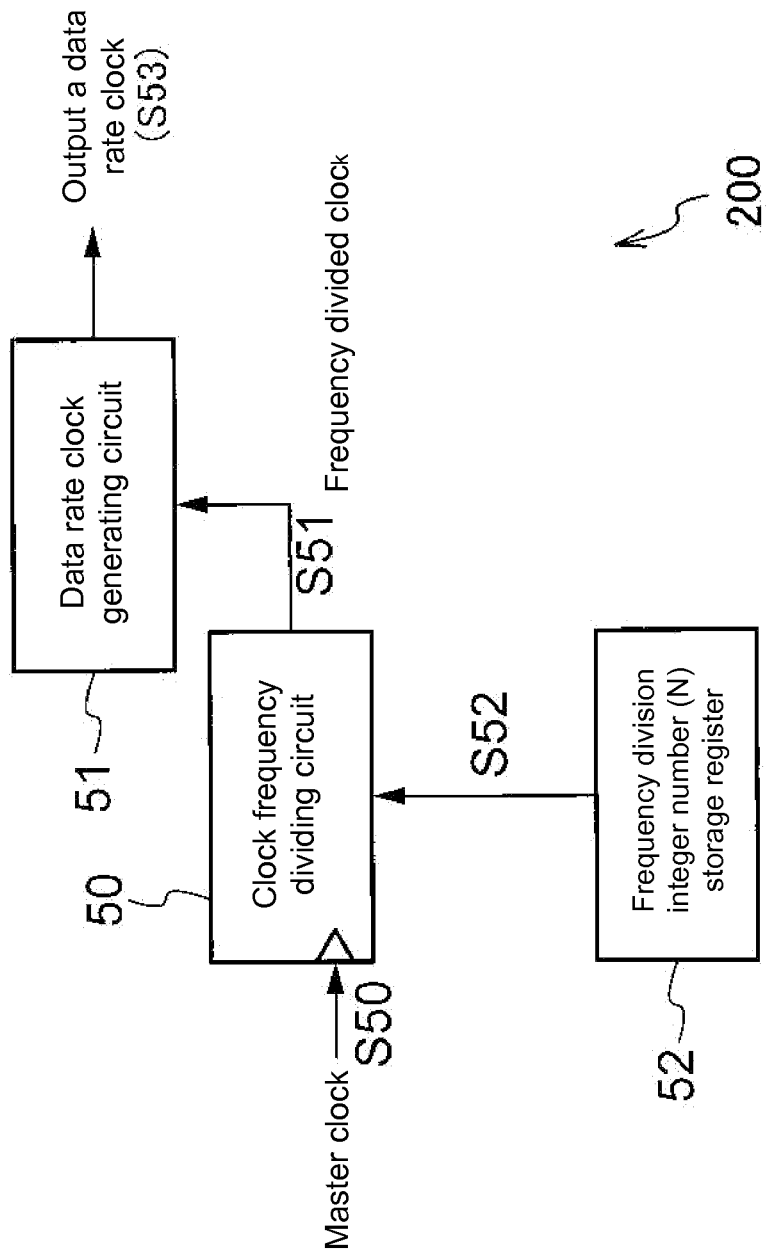
FIG. 4 is a block diagram showing a configuration of a conventional clock generating circuit.
Figure 5:
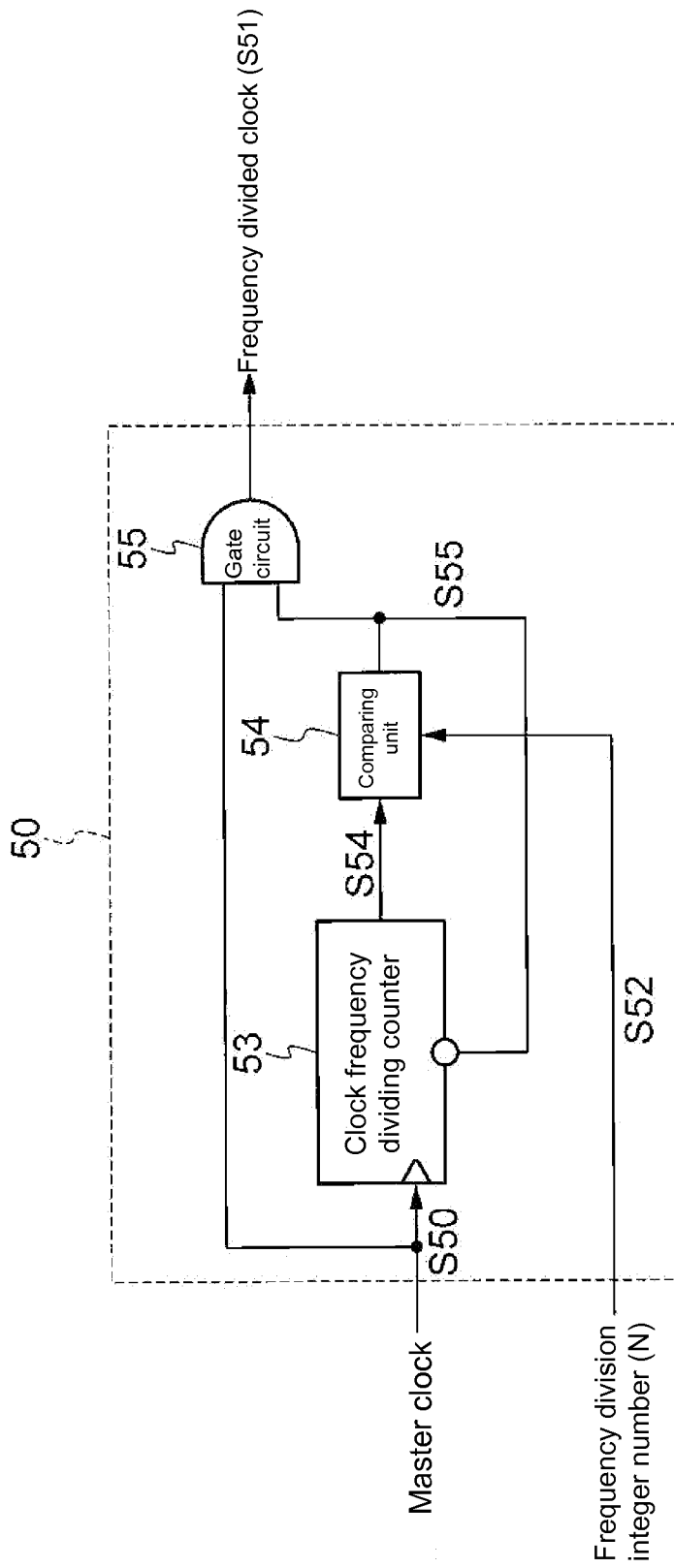
FIG. 5 is a block diagram showing a configuration of a clock frequency dividing circuit of the conventional clock generating circuit.
Figure 6:
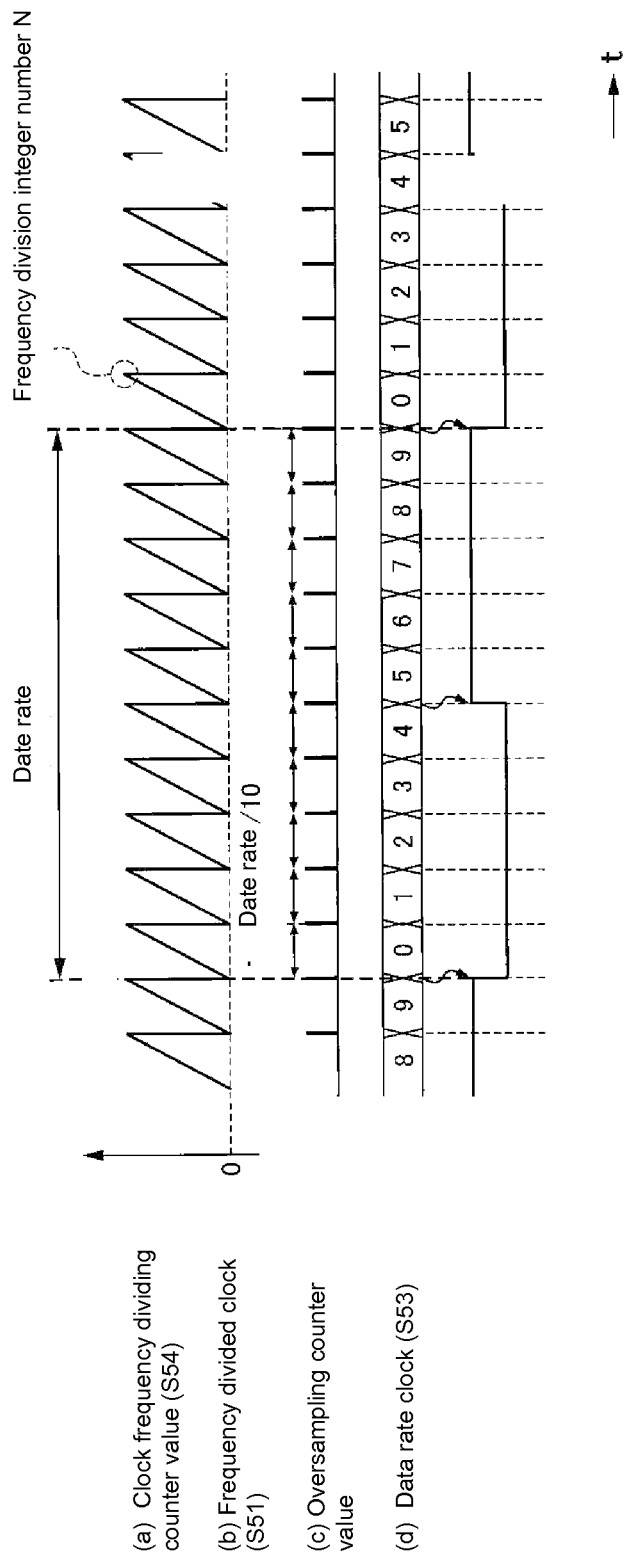
FIG. 6 is a time chart showing signals of the conventional clock generating circuit.

As shown in FIG. 3, a wave chart (a) represents an signal wave form of the clock frequency dividing counter value S11 as the output signal of the clock frequency dividing counter 11. As described above, the clock frequency dividing counter 11 is configured to count up the master clock S0, and to reset according to the signal S12 when the count value reaches the frequency division integer number N1 or the frequency division integer number N2. As a result, as shown in the wave chart (a) in FIG. 3, the signal wave form of the clock frequency dividing counter value S11 becomes a saw-teeth shape.

As shown in FIG. 3, a wave chart (b) represents a signal wave form of the frequency divided clock S1. As described above, the gate circuit 13 is configured to perform the gating of the master clock S0 every time when the count value of the master clock S0 at the clock frequency dividing counter 11 reaches the frequency division integer number N1 or the frequency division integer number N2. As a result, one pulse of the master clock S0 is output per the frequency division integer number N1 or the frequency division integer number N2. Further, as shown in FIG. 3, the frequency divided clock S1 has the frequency k times of the data rate (10 times in the embodiment).

As shown in FIG. 3, a wave chart (c) represents the oversampling counter value S22. As described above, the oversampling counter value S22 is the count value of an oversampling counter that counts the oversampling counter rate k according to the frequency divided clock S1 represented with the wave chart (b) in FIG. 3. It should be noted that the oversampling counter is disposed in the data rate clock generating circuit 2. It should also noted that the oversampling counter value S22 has the counter value between 0 and (k−1), and the counter value is circulated.

In the embodiment, it is configured such that the frequency division according to the frequency division integer number N1 and the frequency division according to the frequency division integer number N2 are switched according to the oversampling counter value S22. More specifically, when the oversampling counter value S22 is zero, the frequency division integer number N2 is selected for the frequency division. When the oversampling counter value S22 is between one and nine, the frequency division integer number N1 is selected for the frequency division.

In the embodiment, the data rate clock generating circuit 2 is configured to change the frequency divided clock S1 from the low (L) level to the high (H) level when the oversampling counter value S22 starts from zero and reaches four. Further, the data rate clock generating circuit 2 is configured to change the frequency divided clock S1 from the high (H) level to the low (L) level when the oversampling counter value S22 reaches nine. When the level of the frequency divided clock S1 is changed over one cycle as described above, the data rate clock S2 is generated according to the data rate as represented with a wave chart (d) in FIG. 3.

As shown in FIG. 3, a wave chart (e) represents a wave form of the transmission data S3 synchronizing with the rising of the data rate clock S2. As described above, the transmission filter 4 is configured to perform the filtering process on the transmission data S3, so that the PLL frequency setting value S4 to be input into the PLL (Pulse Logic Loop) 5 is generated.

As shown in FIG. 3, a wave chart (f) represents a wave form of the PLL frequency setting value S4. When the transmission data S3 is one (the high (H) level), the PLL frequency setting value S4 has the wave shape protruding upwardly. It should be noted that the wave shape of the PLL frequency setting value S4 protruding upwardly continues over a period of time corresponding to 10 clocks of the frequency divided clock S1 (in the oversampling counter value S22 represented with the wave chart (c) in FIG. 3, a period from the counter value 5 to the counter value 6), so that one of the transmission data (one bit of the transmission data) is constituted. When the transmission data S3 is zero (the high (H) level), the PLL frequency setting value S4 has the wave shape protruding downwardly. It should be noted that the wave shape of the PLL frequency setting value S4 protruding downwardly continues over a period of time corresponding to 10 clocks of the frequency divided clock S1, so that one of the transmission data (one bit of the transmission data) is constituted.

In the embodiment, a timing when the oversampling counter value S22 becomes the N2 counter value "0" corresponds also to a timing when the first derivation value becomes a smallest level in the wave form of the PLL frequency setting value S4, that is a timing near an apex of the wave form of the PLL frequency setting value S4 protruding upwardly, or near a valley of the wave form of the PLL frequency setting value S4 protruding downwardly (indicated with "P" of the wave chart (f) in FIG. 3).

In the embodiment, when the timing when the first derivation value becomes the smallest level in the wave form of the PLL frequency setting value S4 corresponds to the timing when the oversampling counter value S22 becomes the N2 counter value "0", it is possible to minimize a change in the frequency at the timing when the frequency division integer number different from the other is used just once over one cycle of the oversampling counter value S22. Accordingly, it is possible to prevent an unnecessary frequency component (spurious).

In the embodiment, as described above, at the timing when the oversampling counter value S22 becomes zero, the frequency division integer number N2 is selected. Further, at the timing when the oversampling counter value S22 becomes between one and nine, the frequency division integer number N1 is selected.

In the embodiment, as shown in the wave chart (a) in FIG. 3, at the timing when the oversampling counter value S22 becomes the N2 counter value "0", that is, the first derivation value becomes the smallest level in the wave form of the PLL frequency setting value S4, the count of the clock frequency dividing counter 11 is complete at the frequency division integer number N2. Further, at the timing when the oversampling counter value S22 becomes between one and nine, the count of the clock frequency dividing counter 11 is complete at the frequency division integer number N1.

In other words, in the embodiment, when the oversampling rate is set to k, the count of the clock frequency dividing counter 11 is controlled with the frequency division integer number N2 in one of the oversampling rate k, and the count of the clock frequency dividing counter 11 is controlled with the frequency division integer number N1 in the other remaining ones (k−1) of the oversampling rate k. When the count of the clock frequency dividing counter 11 is repeatedly controlled through the process described above, the count of the clock frequency dividing counter 11 is complete at the different timing once in the k times. Further, a period of time corresponding to the oversampling rate k corresponds to one bit of the data rate. More specifically, in the semiconductor device 100 in the embodiment, the frequency division integer number N2 is used for adjusting the data rate. Accordingly, even when the frequency is divided with an integer number, it is possible to generate the clock corresponding to the arbitrary data rate.

Next, an effect of the semiconductor device 100 and the method of generating the clock according to the embodiment of the present invention will be explained using a numerical example.

First, it is supposed that the frequency of the master clock f0 is 26 MHz (F0=26 MHz); the data rate D is 2.4 kbps (D=2.4 kbps, that is, the frequency of the data rate FD is 2.4 kHz, FD=2.4 kHz); and the oversampling rate k is (K=10). In this case, the frequency division integer number N1 is given to be 1082 (N1=1083) from the equation (3), and the frequency division integer number N2 is given to be 1086 (N2=1083) from the equation (4).

In the numerical example described above, an adjusted data rate D' after the clock frequency division method according to the present invention is applied is given with the following equation (5).

$$D' = 1/\{((k-1)/(f0/N1)) + (1/(1/f0))\} \quad (5)$$

When each number is input into the equation (5), the adjusted data rate D' is given to be 2.4000738 kbps (D'=2.4000738 kbps). Accordingly, the adjusted data rate D' is shifted from the data rate D (D=2.4 kbps) by about 30 ppm. In other words, the data rate deviation is about 30 ppm.

As described in the section "BACKGROUND OF THE INVENTION AND RELATED ART STATEMENT", in the conventional clock generating circuit 200, the data rate deviation is about 308 ppm in the same numeral example. Accordingly, as compared with the conventional clock generating circuit 200, in the method of generating the clock and the semiconductor device 100 in the embodiment of the present invention, it is possible to reduce the data rate deviation to one tenth of that in conventional clock generating circuit 200.

As described above, in the method of generating the clock and the semiconductor device 100 in the embodiment of the present invention, as compared with the conventional clock generating circuit 200, it is possible to generate the data rate clock having the data rate closer to the desire level.

Further, in the method of generating the clock and the semiconductor device 100 in the embodiment of the present invention, the frequency division integer number N2 is applied to the section corresponding to the section when the first derivation value becomes the smallest level in the wave form of the PLL frequency setting value S4 after passing through the transmission filter 4 constituting the transmission circuit. Accordingly, it is possible to divide the frequency of the clock without generating the spurious or destroying the symmetry of the wave shape of the PLL frequency setting value S4.

Further, in the method of generating the clock and the semiconductor device 100 in the embodiment of the present invention, it is possible to constitute the master clock source using a generic clock generating device (for example, a quartz oscillation element). Accordingly, it is possible to constitute the communication system with a lower cost. Further, it is possible to eliminate a PLL, a masking circuit, and the like. Accordingly, it is possible to constitute the communication system with lower power consumption.

As described above, according to the embodiment of the present invention, it is to provide the method of generating the clock and the semiconductor device capable of generating the clock with a lower cost configuration and lower power consumption. Further, it is possible to minimize the data rate deviation from the target frequency and the temporal fluctuation.

In the embodiment of the present invention, the frequency division integer number N2 is applied to the oversampling counter value S22 between one and nine, and the N2 counter value is zero. The present invention is not limited thereto, and the frequency division integer number N2 may be applied to the oversampling counter value S22 having an arbitrary number.

Further, in the embodiment of the present invention, the oversampling counter value S22 is applied to the timing when the first derivation value becomes a smallest level in the wave form of the PLL frequency setting value S4. The present invention is not limited thereto, and the oversampling counter value S22 may be applied to a timing when the first derivation value becomes any level in the wave form of the PLL frequency setting value S4.

Further, in the embodiment of the present invention, the frequency division integer number N2 (N2=1086) is greater than the frequency division integer number N1 (N1=1083). The present invention is not limited thereto, and the frequency division integer number N2 may be smaller than the frequency division integer number N1. In the embodiment, when the frequency division integer number N2 is calculated with the equation (4), and the resultant value is rounded off to the closest whole number, the frequency division integer number N2 becomes greater than the frequency division integer number N1. When the resultant value is rounded up to the closest whole number, the frequency division integer number N2 becomes smaller than the frequency division integer number N1.

The disclosure of Japanese Patent Application No. 2014-064338, filed on Mar. 26, 2014, is incorporated in the application by reference.

While the invention has been explained with reference to the specific embodiments of the invention, the explanation is illustrative and the invention is limited only by the appended claims.

What is claimed is:

1. A method of generating a clock, comprising the steps of:
   calculating a first frequency division number through dividing a frequency of an input clock by a target frequency and a specific integer k (k≥2);
   calculating a second frequency division number according to the first frequency division number;
   dividing a period of time of one cycle of the target frequency by the specific integer k to obtain sections in a number of the specific integer k;
   dividing the frequency of the input clock with the second frequency division number within one of the sections;
   dividing the frequency of the input clock with the first frequency division number within each remaining one of the sections in a number of (k−1); and
   generating the clock having a frequency with one cycle equal to a period of time corresponding to each of the sections in the number of the specific integer k obtained through dividing the frequency of the input clock.

2. The method of generating the clock according to claim 1, wherein, in the step of calculating the second frequency division number according to the first frequency division number, a remaining time is obtained through subtracting a period of time obtained from a product of a period of time of one cycle of the input clock, the first frequency division number, and the number of (k−1) from the period of time of one cycle of the target frequency, and a quotient is obtained through dividing the remaining time by the period of time of one cycle of the input clock to calculate the second frequency division number.

3. The method of generating the clock according to claim 1, wherein, in the steps of dividing the frequency of the input clock with the second frequency division number, and dividing the frequency of the input clock with the first frequency division number, said input clock is counted and divided up to the first frequency division number within each remaining one of the sections in the number of (k−1), and said input clock is counted and divided up to the second frequency division number within the one of the sections.

4. The method of generating the clock according to claim 1, wherein, in the step of calculating the first frequency division number, said target frequency includes a frequency corresponding to a data rate of a data signal transmitted from a transmission device.

5. The method of generating the clock according to claim 4, wherein, in the step of calculating the first frequency division number, said specific integer k includes an oversampling rate of the data rate.

6. The method of generating the clock according to claim 4, wherein, in the step of calculating the first frequency division number, said transmission device includes a wave filtering device for filtering a low frequency region of the data signal formed of a digital signal to generate a signal for controlling a frequency of a phase synchronizing oscillator, and in the step of dividing the frequency of the input clock with the second frequency division number within the one of the sections, said one of the sections corresponds to a timing when a first derivation value of the signal generated with the wave filtering device becomes a smallest level.

7. A semiconductor device comprising:
a calculation unit configured to calculate a first frequency division number through dividing a frequency of an input clock by a target frequency and a specific integer k (k≥2), and to calculate a second frequency division number according to the first frequency division number;
a frequency dividing unit configured to divide a period of time of one cycle of the target frequency by the specific integer k to obtain sections in a number of the specific integer k, and to divide the frequency of the input clock with the second frequency division number within one of the sections, said frequency dividing unit being configured to divide the frequency of the input clock with the second frequency division number within each remaining one of the sections in a number of (k−1); and
an outputting unit configured to output the clock having a frequency with one cycle equal to a period of time corresponding to each of the sections in the number of the specific integer k obtained through dividing the frequency of the input clock.

8. The semiconductor device according to claim 7, wherein said calculation unit is configured to obtain a remaining time through subtracting a period of time obtained from a product of a period of time of one cycle of the input clock, the first frequency division number, and the number of (k−1) from the period of time of one cycle of the target frequency, and said calculation unit is configured to obtain a quotient through dividing the remaining time by the period of time of one cycle of the input clock to calculate the second frequency division number.

9. The semiconductor device according to claim 7, wherein said frequency dividing unit is configured to count and divide the input clock up to the first frequency division number within each remaining one of the sections in the number of (k−1), and said frequency dividing unit is configured to count and divide the input clock up to the second frequency division number within the one of the sections.

10. The semiconductor device according to claim 7, further comprising:
a clock generating unit for generating a pulse to generate the clock having a frequency k times greater than the target frequency at a timing when the input clock is counted up to the first frequency division number and a timing when the input clock is counted up to the second frequency division number;
a counting unit for assigning identification marks to the clock generated with the clock generating unit to sequentially count the clock; and
a storage unit for storing one of the identification marks specifying the one of the sections,
wherein said frequency dividing unit is configured to divide the frequency of the input clock according to the second frequency division number when a counting number of the counting unit indicates the one of the identification marks specifying the one of the sections.

11. The semiconductor device according to claim 7, further comprising a transmission device for transmitting a data signal according to the clock output from the outputting unit,
wherein said target frequency includes a frequency corresponding to a data rate of the data signal transmitted from the transmission device.

12. The semiconductor device according to claim 11, wherein said specific integer k includes an oversampling rate of the data rate.

13. The semiconductor device according to claim 11, wherein said transmission device includes a wave filtering device for filtering a low frequency region of the data signal formed of a digital signal to generate a signal for controlling a frequency of a phase synchronizing oscillator, and said one of the sections corresponds to a timing when a first derivation value of the signal generated with the wave filtering device becomes a smallest level.

* * * * *